United States Patent
Bautista

(10) Patent No.: US 11,334,459 B2
(45) Date of Patent: May 17, 2022

(54) FLEXIBLE TEST SYSTEMS AND METHODS

(71) Applicant: Advantest Corporation, Tokyo (JP)

(72) Inventor: Michael Bautista, San Jose, CA (US)

(73) Assignee: Advantest Corporation, Tokyo (JP)

( * ) Notice: Subject to any disclaimer, the term of this patent is extended or adjusted under 35 U.S.C. 154(b) by 95 days.

(21) Appl. No.: 16/996,756

(22) Filed: Aug. 18, 2020

(65) Prior Publication Data

US 2022/0058097 A1 Feb. 24, 2022

(51) Int. Cl.
*G06F 11/22* (2006.01)
*G06F 11/263* (2006.01)
*G06F 11/34* (2006.01)
*G06F 11/07* (2006.01)
*G06F 11/273* (2006.01)
(Continued)

(52) U.S. Cl.
CPC ...... *G06F 11/2268* (2013.01); *G01R 31/2815* (2013.01); *G01R 31/2834* (2013.01); *G01R 31/2872* (2013.01); *G01R 31/3171* (2013.01); *G01R 31/31701* (2013.01); *G01R 31/31716* (2013.01); *G01R 31/318307* (2013.01); *G01R 31/318533* (2013.01); *G06F 11/076* (2013.01);
(Continued)

(58) Field of Classification Search
CPC .. G06F 11/2268; G06F 11/076; G06F 11/263; G06F 11/273; G06F 11/3466; G01R 31/2815; G01R 31/2834; G01R 31/2872; G01R 31/31701; G01R 31/3171; G01R 31/31716; G01R 31/318307; G01R 31/318533

USPC ..... 714/704, 30, 742, 724, 727; 324/756.01, 324/762.01, 756.03, 762.06
See application file for complete search history.

(56) References Cited

U.S. PATENT DOCUMENTS 7,174,490 B2 * 2/2007 Evans .............. G01R 31/31903 324/756.07
7,278,079 B2 * 10/2007 Evans .............. G01R 31/31903 324/754.09
(Continued)

FOREIGN PATENT DOCUMENTS

CN 107302477 A 10/2017
WO 2013083839 A1 6/2013

OTHER PUBLICATIONS

Akbay et al., Low-Cost Test of Embedded RF/Analog/Mixed-Signal Circuits in SOPs, May 2004, IEEE, vol. 27, No. 2, pp. 352-363. (Year: 2004).*
(Continued)

*Primary Examiner* — John J Tabone, Jr.

(57) ABSTRACT

Presented embodiments facilitate efficient and effective flexible implementation of different types of testing procedures in a test system. In one embodiment, a test system comprises pre-qualifying test components, functional test components, a controller, a transceiver, and a switch. The pre-qualifying test components are configured to perform pre-qualifying testing on a device under test. The functional test components are configured to perform functional testing on the device under test. The controller is configured to direct selection between the pre-qualifying testing and functional testing. The transceiver is configured to transmit and receive signals to/from the device under test. The switch is configured to selectively couple the transceiver to the pre-qualifying test components and functional test components.

20 Claims, 5 Drawing Sheets

(51) Int. Cl.
*G01R 31/28* (2006.01)
*G01R 31/3183* (2006.01)
*G01R 31/317* (2006.01)
*G01R 31/3185* (2006.01)

(52) U.S. Cl.
CPC .......... *G06F 11/263* (2013.01); *G06F 11/273* (2013.01); *G06F 11/3466* (2013.01)

(56) References Cited

U.S. PATENT DOCUMENTS

| | | | | |
|---|---|---|---|---|
| 7,363,557 B2* | 4/2008 | Evans | ............... | G01R 31/31903 324/756.01 |
| 2003/0196151 A1* | 10/2003 | Evans | ............... | G01R 31/31903 714/724 |
| 2003/0196153 A1* | 10/2003 | Evans | ............... | G01R 31/31903 714/742 |
| 2003/0208713 A1* | 11/2003 | Evans | ............... | G01R 31/31905 714/742 |
| 2005/0265717 A1* | 12/2005 | Zhou | ...................... | G01M 11/00 398/9 |
| 2006/0020867 A1* | 1/2006 | Evans | ............... | G01R 31/31905 714/742 |
| 2009/0039910 A1* | 2/2009 | Frankowsky | ...... | G01R 31/2893 324/756.03 |
| 2010/0048142 A1 | 2/2010 | Hou et al. | | |
| 2010/0095166 A1* | 4/2010 | Krepner | .................. | H04L 43/50 714/704 |
| 2010/0313089 A1* | 12/2010 | Rajski | ............ | G01R 31/318547 714/731 |
| 2014/0281716 A1* | 9/2014 | Azad | .................. | G01R 31/3167 714/30 |

OTHER PUBLICATIONS

Sastry1 et al., HDL Design Architecture for Compatible Multichannel Multi frequency Rate SERIAL Bit Error Rate Tester (BERT) ASIC IP Core for Testing of High Speed Wireless System Products/Applications, 2015, IEEE, pp. 839-843. (Year: 2015).*

* cited by examiner

310
Selecting a first type of testing procedure.

320
Performing the first type of testing procedure on devices under test in the test system.

330
Selecting a second type of testing procedure.

340
Performing the second type of testing procedures on the devices under test in the same test system.

FIG 3

FLEXIBLE TEST SYSTEMS AND METHODS

FIELD OF THE INVENTION

The present invention relates to the field of electronic testing.

BACKGROUND OF THE INVENTION

Electronic systems and devices have made a significant contribution towards the advancement of modern society and have facilitated increased productivity and reduced costs in analyzing and communicating information in a variety of business, science, education, and entertainment applications. These electronic systems and devices are typically tested to ensure proper operation. While testing of the systems and devices has made significant advances, traditional approaches are typically expensive and often have limitations with regards to throughput and convenience.

Devices under test (DUTs) are often complex and require different types of complicated testing procedures to achieve reliable results. Usually, testing is directed to determining if a device under test is performing and functioning properly. In addition, many functional and performance tests require pre-qualifying or pre-screening testing procedures. For example, link quality testing such as Bit Error Rate Testing is performed to check/validate channel integrity.

Conventional testing approaches typically require respective different separate test systems to perform the functional testing and pre-qualifying testing. The DUTs are loaded on the separate/dedicated pre-qualifying test equipment, the pre-qualifying testing (e.g., link quality testing, Bit Error Rate Testing (BERT), etc.) is performed, and then the DUTs are removed from the pre-qualifying test equipment and loaded on different separate functional testers for the functional testing. If functional test errors/debugging indicate additional pre-qualifying type testing is required, the DUTs often have to be moved back and forth again between the functional testers and the separate pre-qualifying testing equipment. A lot of testing related costs are incurred in the loading/unloading of DUTs into the separate pre-qualifying testing equipment and functional testers.

Conventional testing systems typically include a large controlled environmental chamber with racks that contain devices under test (DUTs) in a number of loadboard trays. The loadboard trays are manually populated with devices under test, inserted into the environmental chamber and manually connected to the tester electronics. This process can be labor intensive and cumbersome. An entire tray usually has to be manually removed first before devices under test can be added or removed.

Conventional systems are not typically efficient with respect to multiple different types of testing because: 1) the separate different systems are expensive to build and operate; and 2) physical manipulation (e.g., insertion, removal, etc.) of the devices under test between the separate test systems is labor intensive. The amount of work is considerable because the loadboards typically need to be manually removed from the environmental chamber and changed, manually populated with the numerous devices under test, and then manually recoupled to the tester slice. The conventional test head and oven enclosure access restrictions and typical hardwired nature of the test slice and loadboard coupling all add to the difficulty of the task.

Other aspects of conventional test approaches also often adversely impact productivity and throughput. In order to physically move devices under test from one separate test system to another, the entire conventional tester systems (e.g., test head, oven, etc.) typically need to be shut down and the environmental chamber or oven is opened (losing maintenance of environmental conditions). These cumbersome conventional device under test approaches usually interrupt testing operations of all the devices under test and do not typically allow flexible or continued testing of some devices while other devices are physically manipulated. There is a long felt need for a less expensive and convenient production electronic device testing approach due to costs and difficulties associated traditional approaches to performing different types of testing (e.g., pre-qualifying testing, functional testing, performance testing, etc.).

SUMMARY

Presented embodiments facilitate efficient and effective flexible implementation of different types of testing procedures in a test system. In one embodiment, a test system comprises pre-qualifying test components, functional test components, a controller, a transceiver, and a switch. The pre-qualifying test components are configured to perform pre-qualifying testing on a device under test (DUT). The functional test components are configured to perform functional testing on the DUT. The controller is configured to direct selection between the pre-qualifying testing and functional testing. In one exemplary implementation, the controller provides selection directions dedicated to the DUT. In another exemplary implementation, the controller provides selection directions for multiple DUTs. The transceiver is configured to transmit and receive signals to/from the DUT. The switch is configured to selectively couple the transceiver to the pre-qualifying test components and functional test components.

In one embodiment, the pre-qualifying testing on the DUT includes a Bit Error Rate Test (BERT). The BERT can be directed to testing for link quality. The pre-qualifying test component can be configured to analyze a simple loop back of a test signal forwarded from the pre-qualifying component to a DUT and received back by the pre-qualifying component as a transmit signal from the DUT. The pre-qualifying test component can also be configured to analyze a BERT pattern received from the DUT, wherein the BERT pattern is generated by the DUT. The pre-qualifying testing can check/validate channel integrity.

In one embodiment, the controller is configured to enable continued pre-qualifying testing and functional testing in the single test system. In one exemplary implementation, the selection between pre-qualifying testing and functional testing is performed without physically moving the DUT between sockets of the test system and another separate test system. The functional test can include scan testing. The scan testing can be directed to testing functional operations of the DUT (e.g., Joint Action Test Group (JTAG) type testing, etc.). The controller can include a hard macro that supports BERT. The test system can also comprise an environmental control component configured to control ambient environmental conditions in vicinity of the DUT.

In one embodiment, a testing method includes selecting a first type of testing procedure, performing the first type of testing procedure on devices under test in the test system, selecting a second type of testing, and performing the second type of testing procedure on the devices under test in the same test system. The first type of testing procedure can be a pre-qualifying test procedure. The first type of testing procedure can be a link quality testing (e.g., including a Bit Error Rate Test (BERT), etc.). The first type of testing procedure can include analyzing the bit error rate in a signal received from the devices under test. The second type of testing procedure can be a functional test procedure. The second type of testing procedure can include moving packets to/from the devices under test and analyzing signals of logical bit sequences returned from the devices under test. In one embodiment, the devices under test remain coupled to the test system throughout the respective selecting the first type of testing procedure, performing the first type of testing procedure, selecting the second type of testing, and performing the second type of testing procedure. The second type of testing procedure can be performed in the same test system as the first type of testing procedure without removing the devices under test from the test system and placing them in another separate test system.

Selecting a type of testing procedure and performing the testing procedure can be automatic. Selecting the first type of testing procedure and selecting the second type of testing procedure can be based upon a respective testing type selection trigger. The functional test can utilize automatic test pattern generation (ATPG) sequences.

Selecting the first type of testing procedure, performing the first type of testing procedure, selecting the second type of testing, and performing the second type of testing procedure can be performed iteratively. In one embodiment, a first type of testing procedure is initially selected and performed. If results indicate the initial first type testing is acceptable, the process switches over and proceeds to selection and performance of a second type of testing procedure is selected and performed. In one embodiment, the second type testing (e.g., functional testing, etc.) can have results indicating concerns about first type testing (e.g., pre-qualifying testing problems, etc.). In one exemplary implementation, similar functional testing faults or errors in multiple DUTs outside or beyond expected statistical norms may indicate an issue with the BERT testing. If the second type testing indicates there is an issue with the results of the initial first type testing, an additional version of the first type of testing procedure selection and performance can be executed. The additional version of the first type of testing procedure can be more rigorous than the initial version of the first type of testing procedure. If results of the additional version of the first type of testing procedure are acceptable, the process can switch back and continue with executing the second type of testing. The selection back and forth between first type testing and second type testing can be user initiated or automatic.

In one embodiment, a test system comprises a tester and a loadboard. The tester is configured to direct testing of a device under test, wherein the tester selectively performs Bit Error Rate Testing (BERT) and functional testing on the device under test. The loadboard is communicatively coupled to the tester, wherein the loadboard is configured to communicatively couple and decouple with the device under test. The device under test remains coupled to the loadboard during and between performance of the Bit Error Rate Testing and the functional testing on the device under test. The selection between performance of the Bit Error Rate Testing and the functional testing on the device under test can be automatic. The tester can include a switch configured to selectively couple a transceiver to BERT components and functional test components. The transceiver can be configured to communicatively couple and decouple with the device under test. In one exemplary implementation, the Bit Error Rate Testing results are utilized to analyze channel integrity. Bit Error Rate Testing parameters can include transmit/receive frequency and bit pattern. The tester can include a Field Programmable Gate Array (FPGA).

DESCRIPTION OF THE DRAWINGS

The accompanying drawings, which are incorporated in and form a part of this specification, are included for exemplary illustration of the principles of the present invention and not intended to limit the present invention to the particular implementations illustrated therein. The drawings are not to scale unless otherwise specifically indicated.

FIG. 3 is a block diagram of testing method in accordance with one embodiment.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Presented embodiments facilitate convenient and efficient testing of electronic devices. Devices under test can be readily pre-qualified or pre-screened and functionally tested in a single testing system. In one embodiment, flexible test systems and methods support multiple different test operation modes (e.g., BERT mode, functional test mode, etc.) with the same hardware configuration. In one exemplary implementation, this involves integrating diagnostic test of channel integrity and link quality in a tester system that also performs functional test mode operations. The resulting product can support functional test and link test without reconfiguration, unlike other approaches (e.g., in which the tester/FPGA can be reconfigured to support functional testing or BERT—but not both in a single configuration). The test systems and methods also allow DUTs to be individually in functional test or BER. The flexible test systems and methods are unlike other approaches in which reconfiguration would require termination of functional testing of all DUTs to reconfigure for BERT. The flexible test systems and methods can be directed to enabling BERT analysis in a tester to validate channel integrity by testing or examining the bit error rate associated with the channel.

Figure 1:
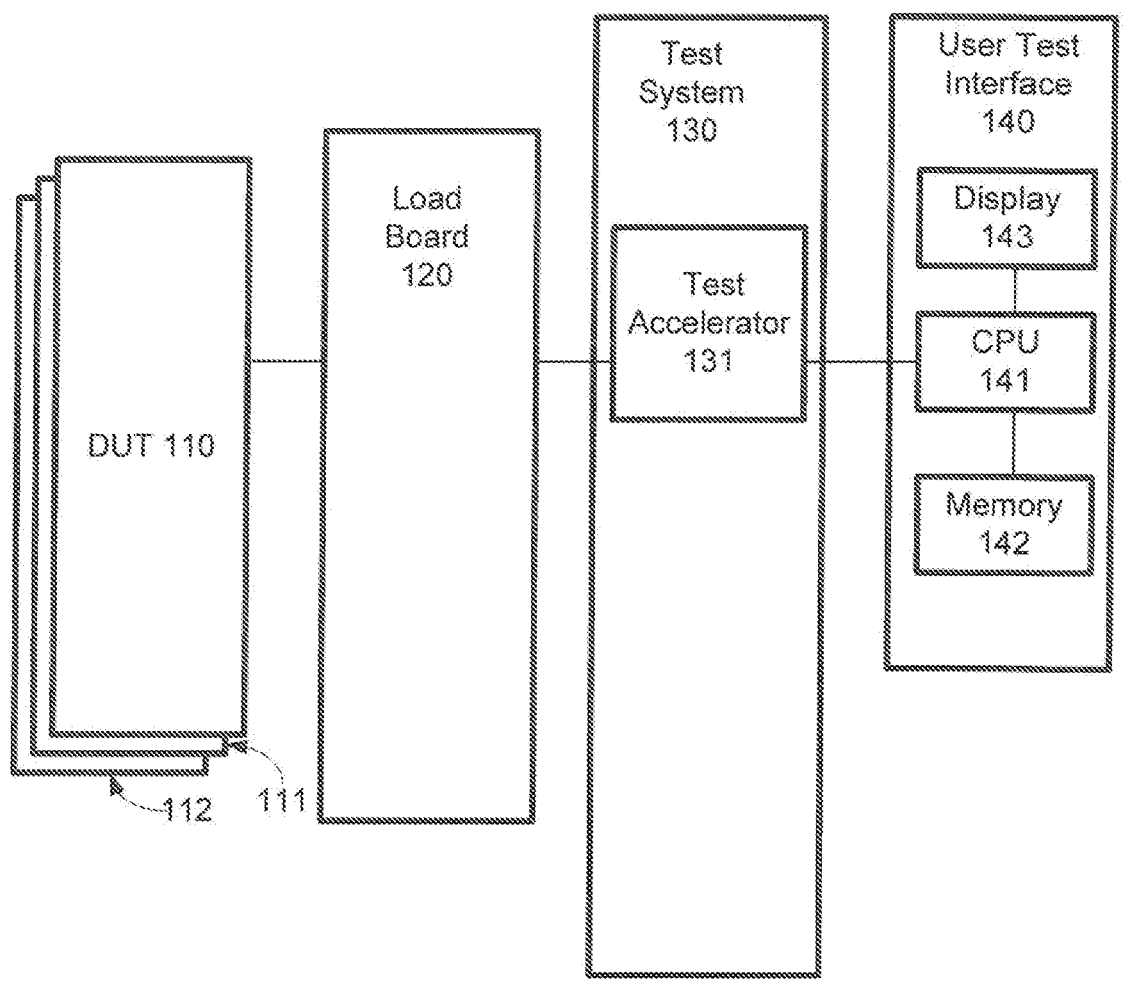
FIG. 1 is a block diagram of an exemplary test environment or system in accordance with one embodiment.

FIG. 1 is a block diagram of an exemplary test environment or system 100 in accordance with one embodiment. The test environment or system 100 includes devices under test (e.g., 110, 111, 112, etc.), loadboard 120, test system 130 and user test interface 140. The devices under test (e.g., 110, 111, 112, etc.) are coupled to the test board or load board 120 which is coupled to test system 130, which in turn is coupled to the user interface 140. User test interface 140 includes CPU 241, memory 142, and display 143. In one embodiment, the test system 130 comprises an FPGA that includes a test accelerator 131. The FPGA is configured to perform preliminary analysis of persistent test information. Loadboard 120 is configured to electrically and physically couple a device under test to the test system.

The conversion from one form or type of testing to another form or type of testing can be automatic. In one embodiment, when results of pre-qualifying testing meet a particular trigger or threshold the system can automatically setup and begin functional testing. In one embodiment, a testing in system can setup and perform more rigorous pre-qualifying testing (e.g., BERT testing, etc.). The more rigorous pre-qualifying testing can be initiated if the initial pre-qualifying testing does not meet the particular benchmark or threshold.

In one embodiment, pre-qualifying testing (e.g., channel integrity testing, BERT, etc.) capabilities and functional testing capabilities are added to a tester. In one exemplary implementation, the tester can include a switch that operates to select between a pre-qualifying testing mode and a functional test mode. The switch transmits the selected information to transceivers. The transceivers are communicatively coupled to devices under test. Access to control and test information can be provided to the user via a common interface.

Figure 2:
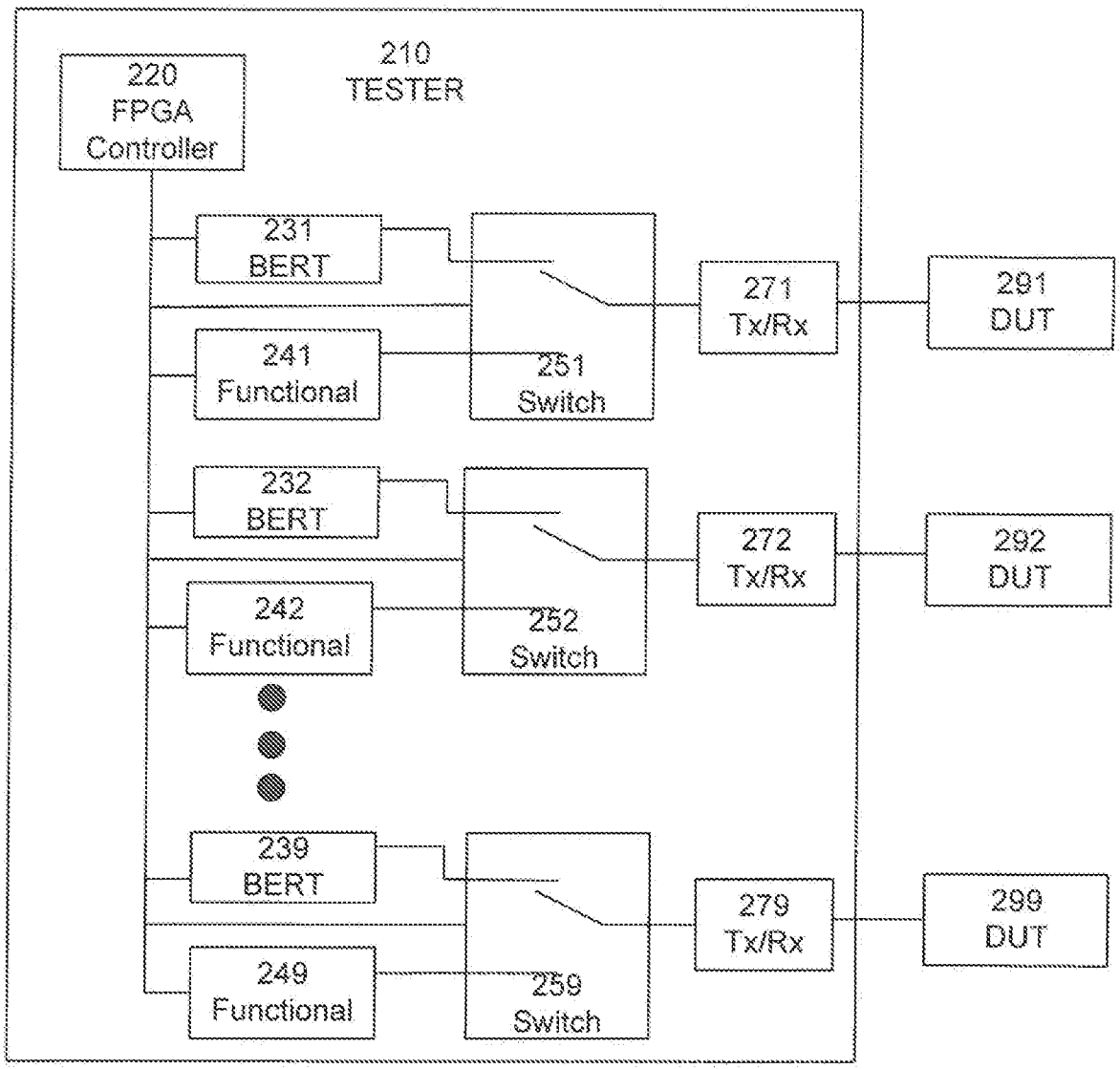
FIG. 2 is a block diagram of exemplary testing system in accordance with one embodiment.

FIG. 2 is a block diagram of exemplary testing system 200 in accordance with one embodiment. Testing system 200 includes tester 210 communicatively coupled to devices under test 291, 292, and 299. Tester 210 includes controller 220, pre-qualifying test components 231, 232, and 293, functional test components 241, 242, and 249, switches 251, 252, and 259, and transceivers 271, 272, and 279. Controller 220 is communicatively coupled to the pre-qualifying test components (e.g., 231, 232, 293, etc.), the functional test components (e.g., 241, 242, 249, etc.), and the switches (e.g., 271, 272, 279, etc.). The pre-qualifying tests can include BERT tests. Switch 251 is communicatively coupled to pre-qualifying test component 231, functional test component 241, and transceiver 271. Switch 252 is communicatively coupled to pre-qualifying test component 232, functional test component 242, and transceiver 272. Switch 259 is communicatively coupled to pre-qualifying test component 239, functional test component 249, and transceiver 279. In one embodiment, the transceivers are Ethernet physical layer (PHY) transceivers.

The components of testing system 200 cooperatively operate to perform multiple types of testing on a single test system. Switch 251 selectively couples and decouples pre-qualifying test component 231 or functional test component 241 to transceiver 271. Switch 252 selectively couples and decouples pre-qualifying test component 232 or functional test component 242 to transceiver 272. Switch 259 selectively couples pre-qualifying test component 239 or functional test component 249 to transceiver 279. Controller 220 controls selection of the respective pre-qualifying test component or functional test component. Controller 220 also participates in directing performance of the respective pre-qualifying testing and functional testing. Transceiver 271 forwards information to and receives information from DUT 291. Transceiver 272 forwards information to and receives information from DUT 292. Transceiver 279 forwards information to and receives information from DUT 279.

In order to minimize logic consumption, in one embodiment there is a single controller within the FPGA that can service selection of a mode (e.g., BERT mode, functional mode, etc.) for multiple DUTs. In an alternate embodiment, each DUT has a dedicated controller which can facilitate faster test time. BERT configurable parameters can include transmit/receive frequency and bit pattern. An FPGA transceiver can have hard macros supporting BERT. In one embodiment, separate BERT components are dedicated to respective individual DUTs. The system and transceivers can be configured correctly to access FPGA transceiver BERT capabilities and to setup transceivers for functional test.

In one embodiment, the BERT mode can be automatically selected and a link quality pre-screening initiated at start up. The tester operations can be automatically switched to the functional mode after the initial BERT mode is complete. Based upon results of the functional testing and as part of a debug process, an optional user initiated or automated switch back to BERT mode can be made.

FIG. 3 is a block diagram of testing method in accordance with one embodiment.

In block 310, a first type of testing procedure is selected. In embodiment, the first type of testing procedures are pre-qualifying test procedures. In one exemplary implementation, the first type of testing procedures are BERT procedures.

In one embodiment, BERT components include a test pattern generator that generates a predetermined stress patterns of logical ones and zeros and an analyzer that compares a response pattern to the sent pattern. It is appreciated various types of BERT tests can be implemented (e.g., Pseudorandom Binary Sequence (PRBS), Quasi Random Signal Source (QRSS), Min./Max, particular ratios of logical ones and zeroes, Bridge Taps, Multipat, etc.).

In block 320, the first type of testing procedure is performed in the test system. The first type of testing procedure is performed on DUTs loaded in the test system In block 330, a second type of testing procedure is selected. The selection can be based upon a testing type trigger. The trigger can be based upon a particular target or threshold.

In block 340, perform a second type of testing procedures in the test system. The second type of testing procedures are performed in the same test system without removing from the test system and placing then in another separate test system. In embodiment, the second type of testing procedures are functional test procedures.

It is appreciated selection of the test system between the first type of testing procedures and the second type of testing procedures can be iterative. In one embodiment, a determination is made in whether to perform additional or more rigorous first type testing and the testing system makes a selection to perform the more rigorous first type testing. In one embodiment, an initial pre-qualifying benchmark or threshold is met and a test system begins functional testing. In one exemplary implementation, the functional testing results have results indicating concerns about pre-qualifying type problems. In one exemplary implementation, similar functional testing faults or errors in multiple DUTs outside or beyond expected statistical norms may indicate an issue with the BERT testing. In one embodiment, a selection back to BERT testing is made without having to remove the DUTs from the testing system and more rigorous BERT testing is performed. It is appreciated the system can again conveniently setup for continued functional testing of the DUTs that pass the more rigorous BERT testing. In one embodiment, a test system can switch back and forth multiple times between pre-qualifying type testing and functional testing.

Figure 4:
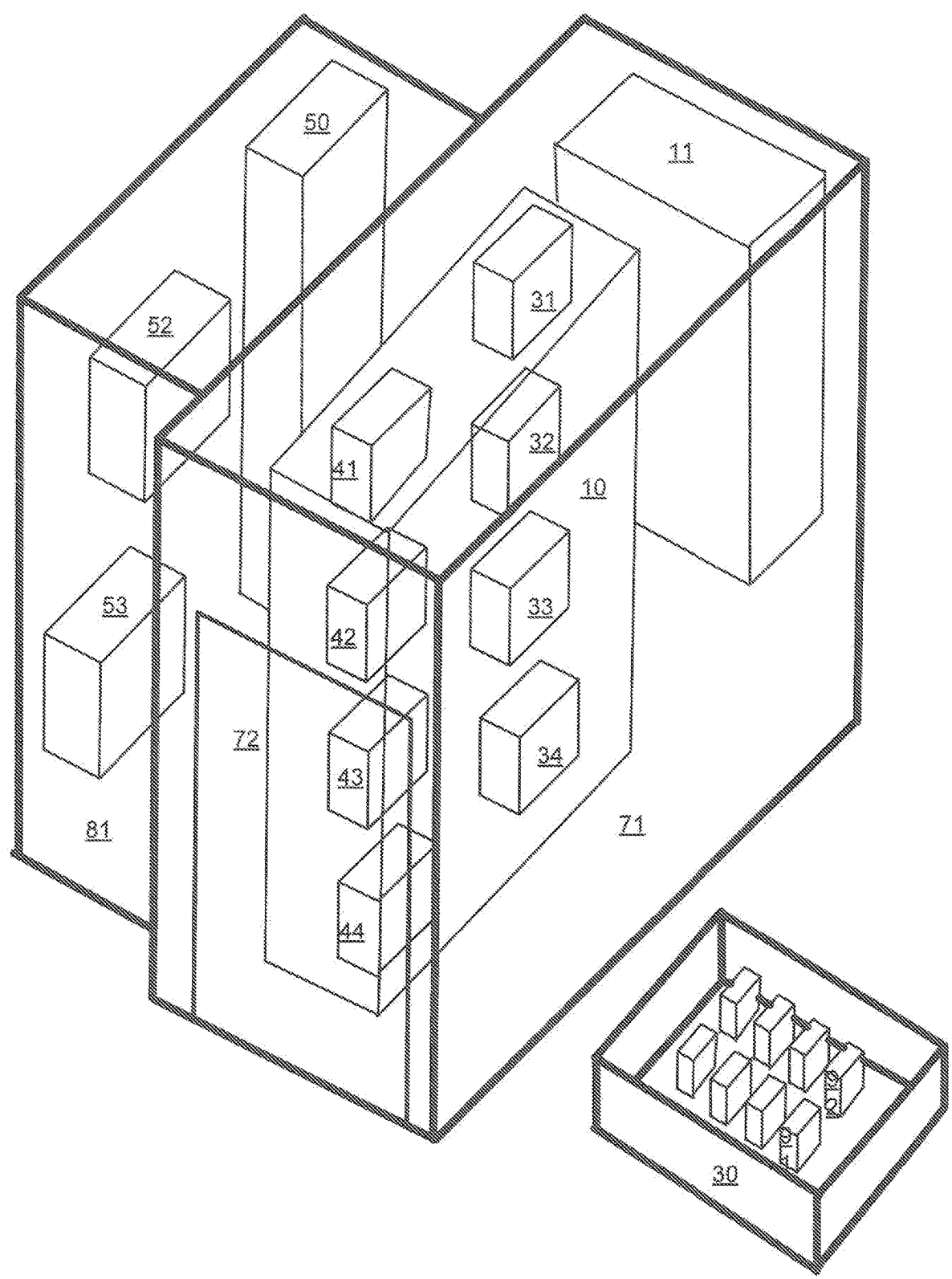
FIG. 4 is a block diagram of an exemplary testing system in accordance with one embodiment.
Figure 5:
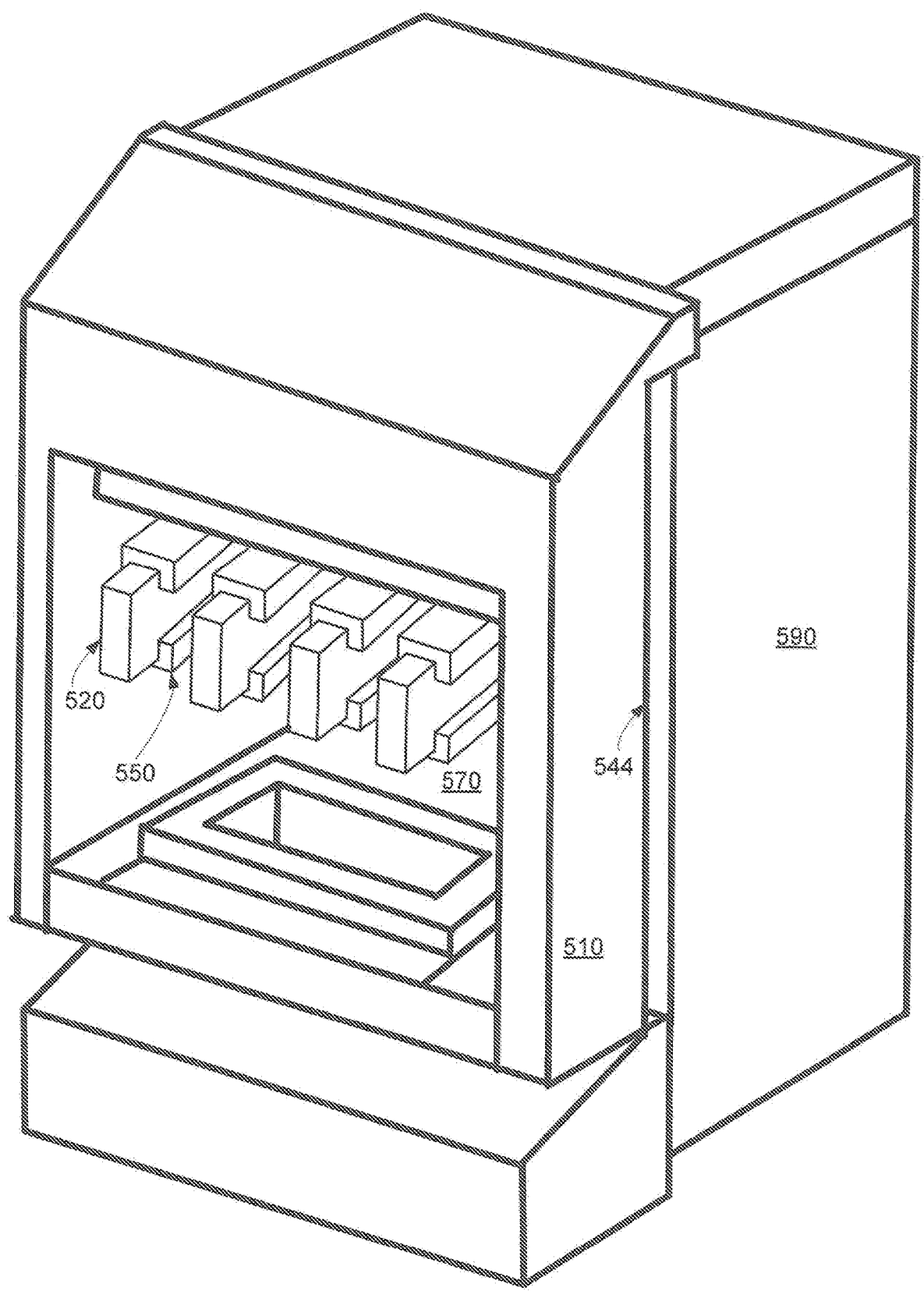
FIG. 5 is a block diagram of another exemplary test system in accordance with one embodiment.

It is appreciated that selectable testing systems and methods can be implemented in various testing system configurations or approaches. FIG. 4 is a block diagram of an exemplary testing system in accordance with one embodiment. It consists of a large controlled environmental chamber or oven 71 that contains an oven rack 10 and heating and cooling elements 11. The oven rack 10 contains devices under test (DUTs) in a number of loadboard trays 31, 32, 33, 34, 41, 42, 43, and 44. The environmental test chamber 71 has solid walls and a solid door 72 that enclose the test rack 10. The heating and cooling elements 11 can have a wide temperature range (e.g., −10 to 120 degrees C.). The tester or test head 81 contains various racked components, including system controller network switches 52, system power supply components 53, and tester slices 50 (the tester slice contains the tester electronics). The loadboard trays (e.g., 30, 31, etc.) are connected to tester slices 50 (multiple loadboard trays can be coupled to a single tester slice). There is also a block diagram of a tester tray 30 and devices under test (e.g., 91, 92, etc.). The loadboard trays are manually populated with devices under test. The full tester trays (e.g., 30, 31, etc.) are manually inserted into environmental chamber 71 and manually connected to the tester electronics (e.g., 50, 52, 53, etc.). This process can be labor intensive and cumbersome (e.g., the process requires opening the door 72 of the environmental chamber 71 and manually trying to insert the trays though the door 72 into the appropriate location). In one embodiment, a flexible test system that implements both pre-qualify testing and functional testing does not require the expensive and time consuming multiple moves of DUTs between separate test systems unlike conventional test approaches In one embodiment, a test system includes a device interface board and tester electronics that control testing operations. The tester electronics can be located in an enclosure which together are referred to as the primitive. The device interface board has a device under test access interface that allows physical manipulation of the devices under test (e.g., manual manipulation, robotic manipulation, etc.). A device under test can be independently manipulated physically with little or no interference or impacts on testing operations of another device under test. Device interface boards and their loadboards can be conveniently setup to accommodate different device form factors. In one embodiment, loadboards are configured with device under test interfaces and universal primitive interfaces. In one exemplary implementation, the device interface board can control an ambient environment of a device under test FIG. 5 is a block diagram of an exemplary test system 500 in accordance with one embodiment. Test system 500 includes a testing primitive 590 (e.g., containing the testing control hardware and power supply components for the devices under test, etc.) and a device interface board (DIB) 510 disposed in front of and coupled to the primitive 590. In one embodiment, the device interface board 510 is a partial enclosure and configured to couple with the devices under test 520 placed in coupling mechanism or component 550. The loadboard is also coupled to and electrically interfaces with the primitive 590 to obtain power and high-speed electrical signals for testing the device under test 520. The device interface board can include air flow channels 544 that allow air flow to and from the device under test environment. The air flow channels 544 can include baffles. The device interface board 510 partial enclosure includes a device under test access interface 570 that enables easy physical access (e.g., unobstructed, unimpeded, etc.) to the devices under test. Environmental control components 511 and 514 control and maintain device under test ambient environmental conditions (e.g., temperature, air flow rate, etc.). The environmental control components can create an environmental envelope that prevents or mitigate interference from outside environmental conditions on the operations of devices under test. While access to test system 500 may be easier than test system 400, a flexible test system that implements both pre-qualify testing and functional testing can still offer benefits of not requiring the expensive and time consuming multiple moves of DUTs between separate test systems unlike conventional test approaches It is appreciated flexible test systems and methods can be utilized to achieve results similar to other testing approaches. In one embodiment, BERT procedures are directed to testing transmission line integrity of a channel similar to other approaches but is performed in a different way. A BERT mode can be viewed in a sense as an alternative/addition to link quality test.

In one embodiment, a BERT features of a DUT includes a loopback feature that can receive a test signal from the tester and send the signal back to the tester as a transmit signal from the DUT. In one embodiment, a DUT has additional capabilities to support BERT. In one exemplary implementation, a DUT can measure a received bit error rate and transmit a BERT pattern to a tester, providing better link quality testing than simple a loopback feature. In a simple BERT loopback DUT configuration it can be difficult to isolate a source of bit errors (e.g., a tester transmit to DUT receive link, a DUT transmit to Tester receive link, etc.). However, detecting a source of an error can be easier in DUTs that can measure a received bit error rate and transmit a BERT pattern facilitate.

Thus, embodiments of the present invention can facilitate efficient and effective testing with convenient multiple different types of testing procedures on devices under test in a single test system. In one embodiment, flexible testing systems and methods do not need separate/dedicated test equipment to perform pre-qualifying testing (e.g., link quality testing, BERT testing, etc.) and functional testing. In one exemplary implementation, a test system can readily support multiple different types of testing by convenient switching between pre-qualifying testing and functional testing without altering other testing electronic components (e.g., primitives, other device interface boards, etc.). Overall testing can be performed faster and overall customer costs are reduced. In one embodiment, the reduction in costs are associated with 1) loading and unloading from pre-screen BERT dedicated machines; 2) supplying/maintaining dedicated BERT equipment; and 3) providing factory floor space for dedicated BERT equipment.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

It is appreciated that embodiments of the present invention can be compatible and implemented with a variety of different types of tangible memory or storage (e.g., RAM, DRAM, flash, hard drive, CD, DVD, etc.). The memory or storage, while able to be changed or rewritten, can be considered a non-transitory storage medium. By indicating a non-transitory storage medium it is not intend to limit characteristics of the medium, and can include a variety of storage mediums (e.g., programmable, erasable, nonprogrammable, read/write, read only, etc.) and "non-transitory" computer-readable media comprises all computer-readable media, with the sole exception being a transitory, propagating signal.

It is appreciated that the following is a listing of exemplary concepts or embodiments associated with the novel approach. It is also appreciated that the listing is not exhaustive and does not necessarily include all possible implementation. The following concepts and embodiments can be implemented in hardware. In one embodiment, the following methods or process describe operations performed by various processing components or units. In one exemplary implementation, instructions, or directions associated with the methods, processes, operations etc. can be stored in a memory and cause a processor to implement the operations, functions, actions, etc.

It is appreciated that a memory storage management systems and methods can include the following exemplary concepts or embodiments. It is also appreciated that the listing is not exhaustive and does not necessarily include all possible implementations. The following concepts and embodiments can be implemented in hardware, firmware, software, and so on. In one embodiment, the following concepts include methods or processes that describe operations performed by various processing components or units. In one exemplary implementation, instructions or directions associated with the methods, processes, operations etc. can be stored in a memory and cause a processor to implement the operations, functions, actions, etc.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. The listing of steps within method claims do not imply any particular order to performing the steps, unless explicitly stated in the claim.

What is claimed is:

1. A test system comprising:
   a pre-qualifying test component configured to perform pre-qualifying testing on a device under test (DUT), including Bit Error Rate Test (BERT) for link quality, wherein the pre-qualifying test component is configured to analyze both:
      a simple loop back of a test signal forwarded from the pre-qualifying component to the DUT and received back by the pre-qualifying component as a transmit signal from the DUT, and
      a BERT pattern received from the DUT, wherein the BERT pattern is generated by the DUT;
   a functional test component configured to perform functional testing on the DUT;
   a controller configured to direct selection between the pre-qualifying testing and the functional testing for the DUT, wherein the controller is dedicated to directing selection for the DUT;
   a transceiver configured to transmit and receive signals to/from the DUT; and
   a switch configured to selectively couple the transceiver to the pre-qualifying test component and the functional test component.

2. The test system of claim 1, wherein the pre-qualifying testing checks/validates channel integrity.

3. The test system of claim 1, wherein the functional test includes scan testing.

4. The test system of claim 1, wherein the controller is configured to enable continued pre-qualifying testing and functional testing in the single test system.

5. The test system of claim 1, wherein the selection between pre-qualifying testing and functional testing is performed without physically moving the DUT between sockets of the test system and another separate test system.

6. The test system of claim 1, wherein the controller includes a hard macro that supports BERT.

7. The test system of claim 1, further comprising an environmental control component configured to control ambient environmental conditions in vicinity of the DUT.

8. A testing method comprising:
   selecting a first type of testing procedure, wherein the first type of testing is a link quality testing including a Bit Error Rate Test (BERT);
   performing the first type of testing procedure on devices under test in the test system, including analyzing the bit error rate in a signal received from the devices under test,
   selecting a second type of testing, wherein the second type of testing is a functional test; and
   performing the second type of testing procedure on the devices under test in the same test system, including forwarding test patterns to the devices under test and analyzing signals of logical bit sequences returned from the devices under test, wherein the devices under test remain coupled to the test system throughout the respective, selecting a first type of testing procedure, the performing the first type of testing procedure, the selecting a second type of testing, and the performing the second type of testing procedure.

9. The test method of claim 8, wherein the selecting the first type of testing procedure, the performing the first type of testing procedure, the selecting the second type of testing, and the performing the second type of testing procedure are automatic.

10. The test method of claim 8, wherein the selecting the first type of testing procedure and the selecting the second type of testing procedure is based upon a respective testing type selection trigger.

11. The test method of claim 8, wherein the selecting a first type of testing procedure, the performing the first type of testing procedure, the selecting a second type of testing, and the performing the second type of testing procedure are performed iteratively.

12. The test method of claim 8, wherein:
the selecting a first type of testing procedure and the performing the first type of testing procedure are initially performed,
the selecting a first type of testing procedure and the performing the first type of testing procedure are executed if results indicate the first type testing is acceptable,
executing an additional version of the selecting a first type of testing procedure and the performing the first type of testing procedure if the second type testing indicates there is an issue with the results of the first type testing; and
executing an additional version of the selecting a second type of testing procedure and the performing the second type of testing procedure if the additional version of the performing the first type of testing procedure is acceptable.

13. The test method of claim 8, wherein the additional version of the first type of testing procedure is more rigorous than the initial version of the first type of testing procedure.

14. The test method of claim 8, wherein the functional test includes scan test procedures utilizing automatic test pattern generation (ATPG) sequences.

15. A test system comprising:
a tester configured to direct testing of a device under test, wherein the tester selectively performs Bit Error Rate Testing (BERT) and functional testing on the device under test; and
a loadboard communicatively coupled to the tester, wherein the loadboard is configured to communicatively couple and decouple with the device under test, and wherein the device under test remains coupled to the loadboard during and between performance of the BERT and the functional testing on the device under test.

16. The test system of claim 15, wherein selection between performance of the BERT and the functional testing on the device under test is automatic.

17. The test system of claim 15, wherein the tester includes a switch configured to selectively couple a transceiver to a BERT component and a functional test component, wherein the transceiver is configured to communicatively couple and decouple with the device under test.

18. The test system of claim 15, wherein the Bit Error Rate Testing results are utilized to analyze channel integrity.

19. The test system of claim 15, wherein Bit Error Rate Testing parameters include transmit/receive frequency and bit pattern.

20. The test system of claim 15, wherein the tester includes a Field Programmable Gate Array (FPGA).

\* \* \* \* \*